(12) United States Patent
Claseman

(10) Patent No.: US 7,394,729 B2
(45) Date of Patent: Jul. 1, 2008

(54) TIME CONSTANT BASED FIXED PARAMETER ASSIGNMENT

(75) Inventor: George R. Claseman, Campbell, CA (US)

(73) Assignee: Micrel, Inc., San Jose, CA (US)

( * ) Notice: Subject to any disclaimer, the term of this patent is extended or adjusted under 35 U.S.C. 154(b) by 982 days.

(21) Appl. No.: 10/845,809

(22) Filed: May 13, 2004

(65) Prior Publication Data

US 2005/0267699 A1 Dec. 1, 2005

(51) Int. Cl.
*G04F 8/00* (2006.01)
*G04F 10/00* (2006.01)
*G06K 7/38* (2006.01)
*H03K 19/0175* (2006.01)

(52) U.S. Cl. .............................. 368/113; 326/38; 326/80
(58) Field of Classification Search .................... 368/10, 368/113; 326/37, 38, 80
See application file for complete search history.

(56) References Cited

U.S. PATENT DOCUMENTS 3,761,805 A * 9/1973 Domberger ................. 324/677
4,242,637 A * 12/1980 Ferguson .................... 327/27
4,250,407 A * 2/1981 Dorey et al. ................. 326/47
4,504,155 A * 3/1985 Ruggieri ..................... 368/121
5,045,990 A * 9/1991 Stanley ....................... 363/43
6,400,605 B1 * 6/2002 Adkins .................. 365/185.18
6,515,507 B1 * 2/2003 Patel et al. ..................... 326/38
6,674,304 B1 * 1/2004 Matthews ..................... 326/80
6,748,545 B1 * 6/2004 Helms ......................... 713/300
6,771,675 B1 * 8/2004 Cao et al. .................... 370/537
6,794,899 B2 * 9/2004 Lee et al. ...................... 326/59
6,812,734 B1 * 11/2004 Shumarayev et al. ......... 326/30

* cited by examiner

*Primary Examiner*—Vit W Miska
(74) *Attorney, Agent, or Firm*—Patent Law Group LLP; Carmen C. Cook

(57) ABSTRACT

A method for assigning a value to a fixed parameter in an electrical device where the fixed parameter has multiple states includes associating a time value to each state of the fixed parameter, driving a first input terminal of the electrical device to a first voltage value, receiving an input ramp signal on the first input terminal where the input ramp signal has a first time constant value and a voltage magnitude that varies from the first voltage value to a second voltage value, comparing the voltage level of the input ramp signal to a threshold value, when the voltage level of the input ramp signal reaches the threshold value, determining the elapsed time from the driving of the first input terminal, and selecting a state for the fixed parameter based on the amount of elapsed time until the voltage level of the input ramp signal reaches the threshold level.

11 Claims, 1 Drawing Sheet

TIME CONSTANT BASED FIXED PARAMETER ASSIGNMENT

FIELD OF THE INVENTION

The invention relates to a method for fixed parameter assignment in an integrated circuit and, in particular, to a method for fixed parameter assignment using a reduced number of input/output pins.

DESCRIPTION OF THE RELATED ART

Electrical devices or integrated circuits providing application specific functions often require assignment of values for certain fixed parameters on the devices upon start-up in order to operate in the application in which the devices are incorporated. Fixed parameter assignment is often used for address assignments, selecting a mode of operation, and selecting other fixed operating personality elements of the device. Examples of devices where mode selection is used are Ethernet devices using a large number of addressing pins for programming, hardware devices including one or more fixed operation modes, and digital and analog devices using SM bus (system management bus) addressing as the control and status interface. These devices are often designed with multiple operational personalities whereby one or a group of operational personalities are selected when the device is installed for use. The selected personalities are usually permanent to be used for the life-time of the device in the application.

In many integrated circuits, the desired mode or function is usually selected by programming one or more fixed parameters through one or more input/output (I/O) pins of the integrated circuit. A specific address, mode or personality is selected by assigning a specific value to a parameter in the integrated circuit in which the parameter is linked to the desired address, operation mode or personality. Conventional fixed parameter assignment is typically implemented using a binary strap option. That is, a pin is connected either to a logical high voltage or a logical low voltage to select one of two possible states for a predefined parameter.

When a parameter is linked to multiple choices or is associated with long fields, multiple I/O pins will be required to implement fixed parameter value assignment when the binary strap method is used. Excessive pin count is undesirable as it results in increased material and manufacturing cost. Alternate methods exist for assigning values to fixed parameters on an electrical device, but generally these alternate methods require an additional external storage device.

It is desirable to provide a method for fixed parameter assignment using minimum I/O pins.

SUMMARY OF THE INVENTION

According to one embodiment of the present invention, a method for assigning a value to a fixed parameter in an electrical device where the fixed parameter has multiple states includes associating a time value to each of the states of the fixed parameter, driving a first input terminal of the electrical device to a first voltage value, receiving an input ramp signal on the first input terminal of the electrical device where the input ramp signal has a first time constant value and a voltage magnitude that varies from the first voltage value to a second voltage value, comparing the voltage level of the input ramp signal to a threshold value, when the voltage level of the input ramp signal reaches the threshold value, determining the elapsed time from the driving of the first input terminal; and selecting a state for the fixed parameter based on the amount of elapsed time from the driving of the first input terminal to the voltage level of the input ramp signal reaching the threshold level. The input ramp signal is initiated when the first input terminal is driven to the first voltage value.

In one embodiment, the elapsed time is measured by a count value counting the number of clock cycles of an internal clock until the input ramp signal reaches the threshold value.

The present invention is better understood upon consideration of the detailed description below and the accompanying drawings.

DETAILED DESCRIPTION OF THE PREFERRED EMBODIMENTS

In accordance with the principles of the present invention, a method for fixed parameter assignment uses a time based charging circuit to program various fixed parameters on an electrical device. The time based charging circuit provides a ramp signal whose time constant is used to indicate a desired programming value for the fixed parameter. The method minimizes the number of input/output pins that are required to program multiple fixed parameters or fixed parameters including long programming fields.

Figure 1:
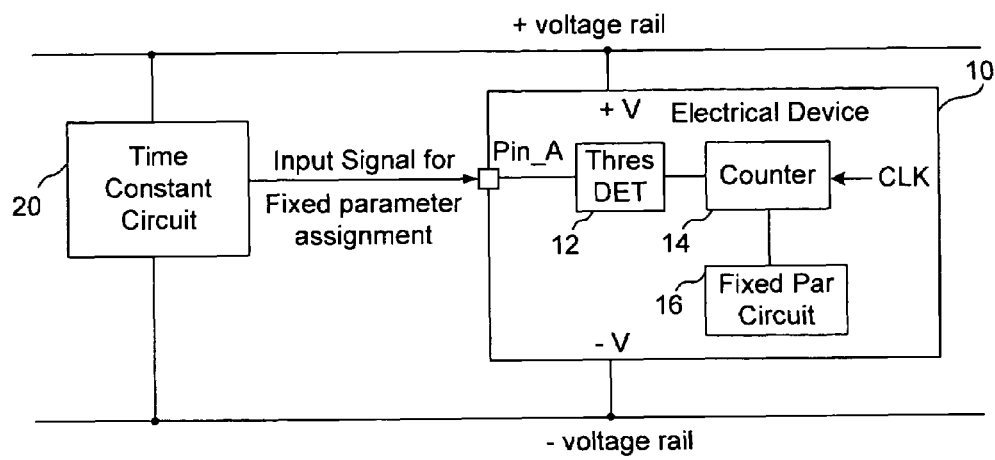
FIG. 1 is a schematic diagram of an electrical device employing the fixed parameter value assignment method according to one embodiment of the present invention.
Figure 2:
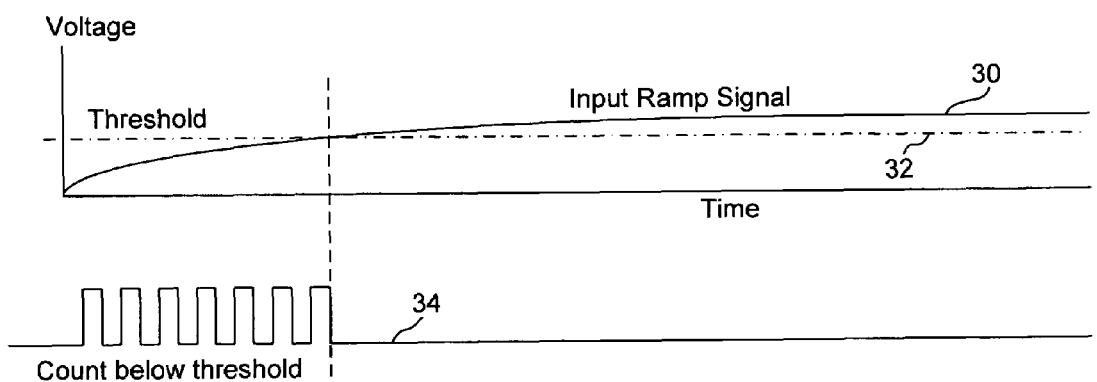
FIG. 2 is a timing diagram illustrating the operation of the fixed parameter value assignment method of the present invention.

FIG. 1 is a schematic diagram of an electrical device employing the fixed parameter value assignment method according to one embodiment of the present invention. FIG. 2 is a timing diagram illustrating the operation of the fixed parameter value assignment method of the present invention. Referring to FIG. 1, an electrical device 10 is incorporated in a system for performing an application specific function. Electrical device 10 includes input/output terminals (not shown) for receiving incoming signals from and providing output signals to other components in the system. Electrical device 10 can be an integrated circuit in which case the input/output terminals are typically referred to as input/output (I/O) pins. When electrical device 10 is incorporated in a system for normal operation, the device is coupled to a positive voltage rail providing a positive power supply voltage (+V) and a negative voltage rail providing a negative power supply voltage (−V). Typically, the positive power supply voltage is referred to as the Vdd voltage and can be between 3.3 and 5 volts while the negative power supply voltage is referred to as the Vss voltage and is usually the ground voltage (0 volts).

The fixed parameter assignment method of the present invention uses a time based charging circuit external to the electrical device providing a ramp signal on an I/O pin of the electrical device for fixed parameter value assignment. The time constant of the ramp signal is used to select a value for the fixed parameter. In one embodiment, the time constant of the ramp signal is measured as the time it takes for the ramp signal to reach a predefined threshold level. The elapsed time is measured and used for selecting the corresponding value for the fixed parameter. The selected value of the fixed parameter can be used to select one of several operation modes on device 10 or used to assign an address value for an address field in device 10.

In the present embodiment, electrical device 10 includes an I/O pin PIN_A designated for fixed parameter assignment. PIN_A receives the input ramp signal from a time based charging circuit, denoted as a time constant circuit 20 in FIG. 1. Time constant circuit 20 can be implemented in any convention fashion to provide a ramp signal having a given time constant. FIG. 2 illustrates a ramp signal 30 generated by time constant circuit 20 and provided to Pin_A of electrical device 10. In one embodiment, time constant circuit 20 is implemented as an RC circuit where the resistance and capacitance values are selected to give the desired time constant. The input ramp signal is typically initiated upon the start up or power up of electrical device 10. In this manner, the desired operational mode or address values is programmed on the electrical device whenever the device is powered up. Alternately, the input ramp signal can be initiated whenever Pin_A is driven to the starting voltage value of the input ramp signal. The starting voltage of the input ramp signal is also the voltage level opposite to the steady state voltage value for Pin_A. In other words, the programming of the fixed parameter associated with Pin_A is not restricted to occur only during power-up or device start-up time but the programming can take place when desired by driving the voltage on Pin_A to the starting voltage of the input ramp signal.

In the present embodiment, the fixed parameter assignment method of the present invention determines the time constant of the input ramp signal by counting the number of clock cycles of an internal clock signal until the ramp signal reaches the threshold level. The count is indicative of the time constant of the ramp signal and is used to program a desired value for the fixed parameter. In the present embodiment, electrical device 10 includes a threshold detect circuit 12, a counter circuit 14 and a fixed parameter circuit 16. Threshold detect circuit 12 receives the input ramp signal and monitors the voltage value of the input ramp signal. Threshold detect circuit 12 asserts an output signal when the voltage value of the ramp signal reaches the threshold level. Meanwhile, counter circuit 14 receives a clock signal from a clock source internal to electrical device 10 and also receives the output signal from threshold detect circuit 12. When the input ramp signal is initiated, counter circuit 14 commences counting and the counting is halted when the output signal from threshold detect circuit 12 is asserted. The state to be selected or the value of the fixed parameter is determined when the count is stopped. When the count is stopped, the number of counts counted is then provided to fixed parameter circuit 16 to select a corresponding value for the fixed parameter associated with Pin_A.

The operation of the fixed parameter assignment method of the present invention is as follows. Upon power up or when desired, the programming I/O pin, that is Pin_A, is driven to the opposite state it normally would be at in steady state. In other words, Pin_A is driven to the starting voltage value of the input ramp signal.

Counter circuit 14 also starts to count based on the clock signal from the internal clock source. The clock count is depicted as signal line 34 in FIG. 2. At the same time, time constant circuit 20 initiates the input ramp signal to the starting voltage value and provides the input ramp signal to Pin_A to charge the voltage level at the pin back up to the steady state value. When the voltage level of input ramp signal 30 reaches the predefined threshold level indicated by a line 32, threshold detect circuit 12 asserts its output signal to cause counter circuit 14 to halt counting. As shown in FIG. 2, when input ramp signal 30 crosses line 32, counting of the clock signal is halted (signal line 34). The number of counts before counting is halted is captured by fixed parameter circuit 16 to select the corresponding value for the fixed parameter. For instance, the binary value of the count can be used as the programmed value of the fixed parameter.

The amount of information that can be programmed by a single pin using the time based fixed parameter assignment method of the present invention is determined by the maximum value that can be used as the threshold level. For a given clock rate, a higher threshold level will permit a wider range of time constant values to be programmed. Typically, the threshold level has a voltage value between the positive power supply voltage and the negative power supply voltage of electrical device 10.

The above embodiment describes using a clock count as a measure of the elapsed time from the start of the ramp signal to the ramp signal reaching the threshold level. The start of the ramp signal is typically associated with the start-up of the electrical device and is signaled by the driving of the voltage on Pin_A to a voltage value that is opposite to the steady state value. One of ordinary skill in the art would appreciate that other methods for measuring the elapsed time can also be used to practice the fixed parameter value assignment method of the present invention.

For large addressing fields, groups of address bits can be assigned using a single I/O pin. In one embodiment, the threshold level is selected so that the fixed parameter circuit can detect eight different count values. Thus, a single pin can be used to program three address bits. In this manner, multiple pins can be used for programming large addressing fields.

In other applications, complex internal states can be narrowed down to a smaller subset of possibilities which are defined by the external state assignment. The complexity of implementing the parameter assignment function can thus be simplified.

The above detailed descriptions are provided to illustrate specific embodiments of the present invention and are not intended to be limiting. Numerous modifications and variations within the scope of the present invention are possible. The present invention is defined by the appended claims.

I claim:

1. A method for assigning a value to a fixed parameter in an electrical device, the fixed parameter having a plurality of states, the method comprising:

associating a time value to each of the plurality of states of the fixed parameter;

driving a first input terminal of the electrical device to a first voltage value;

receiving an input ramp signal on the first input terminal of the electrical device, the input ramp signal having a first time constant value and a voltage magnitude that varies from the first voltage value to a second voltage value, the input ramp signal being initiated when the first input terminal is driven to the first voltage value;

comparing the voltage level of the input ramp signal to a threshold value;

when the voltage level of the input ramp signal reaches the threshold value, determining the elapsed time from the driving of the first input terminal; and selecting a state for the fixed parameter based on the elapsed time from the driving of the first input terminal to the voltage level of the input ramp signal reaching the threshold level.

2. The method of claim 1, wherein the plurality of states of the fixed parameter are associated with a plurality of operational modes of the electrical device.

3. The method of claim 1, wherein each of the plurality of states of the fixed parameter is associated with an address bit of a multi-bit addressing field.

4. The method of claim 1, wherein associating a time value to each of the plurality of states of the fixed parameter comprises associating a count value to each of the plurality of states of the fixed parameter, and wherein the method further comprises:
  initiating a count of the number of clock cycles of a clock signal at the same time as the driving of the first input terminal of the electrical device to a first voltage value;
  when the voltage level of the input ramp signal reaches the threshold value, asserting a halt signal;
  stopping the count when the halt signal is asserted; and
  selecting a state for the fixed parameter based on the count of the number of clock cycles before the count is stopped.

5. A method for assigning a value to a fixed parameter in an electrical device, the fixed parameter having a plurality of states, the method comprising:
  associating a count value to each of the plurality of states of the fixed parameter;
  driving a first input terminal of the electrical device to a first voltage value;
  initiating a count of the number of clock cycles of a clock signal;
  at the same time as the initiating of the count, receiving an input ramp signal on the first input terminal of the electrical device, the input ramp signal having a voltage magnitude that varies from the first voltage value to a second voltage value in a first time constant value, the input ramp signal being initiated when the count is initiated;
  comparing the voltage level of the input ramp signal to a threshold value;
  when the voltage level of the input ramp signal reaches a threshold value, asserting a halt signal;
  stopping the count when the halt signal is asserted; and
  selecting a state for the fixed parameter based on the count of the number of clock cycles before the count is stopped.

6. The method of claim 5, wherein the plurality of states of the fixed parameter are associated with a plurality of operational modes of the electrical device.

7. The method of claim 5, wherein each of the plurality of states of the fixed parameter is associated with an address bit of a multi-bit addressing field.

8. An electrical device including a fixed parameter to be programmed when the electrical device is in use, the electrical device comprising:
  a fixed parameter circuit receiving an input signal and providing an output signal indicative of a selected state for the fixed parameter having a plurality of states, the fixed parameter circuit associating a time value to each of the plurality of states of the fixed parameter;
  an input terminal coupled to receive an input ramp signal, the input ramp signal having a time constant value and a voltage magnitude that varies from a first voltage value to a second voltage value, the input ramp signal being initiated when the input terminal is driven to the first voltage;
  a threshold detector coupled to the input terminal for receiving the input ramp signal, the threshold detector asserting an output signal when the voltage value of the input ramp signal reaches a threshold value; and
  a time measurement circuit for measuring an elapsed time since the initiation of the input ramp signal to the assertion of the output signal of the threshold detector;
  wherein the fixed parameter circuit selects a state for the fixed parameter based on the elapsed time.

9. The electrical device of claim 8, wherein the plurality of states of the fixed parameter are associated with a plurality of operational modes of the electrical device.

10. The electrical device of claim 8, wherein each of the plurality of states of the fixed parameter is associated with an address bit of a multi-bit addressing field.

11. The electrical device of claim 8, wherein the time measurement circuit comprises:
  a counter circuit receiving a clock signal and counting the number of clock cycles of the clock signal at the initiation of the input ramp signal, the counter circuit receiving the output signal from the threshold detector and stopping counting of the clock cycles when the output signal is asserted, wherein the number of clock cycles counted before the counting is stopped is indicative of the elapsed time.

* * * * *